(12) United States Patent
Sleven (10) Patent No.: US 8,730,681 B2
(45) Date of Patent: May 20, 2014

(54) POWER SEMICONDUCTOR MODULE WITH WIRELESS SAW TEMPERATURE SENSOR

(75) Inventor: Michael Sleven, Recklinghausen (DE)

(73) Assignee: Infineon Technologies AG, Neubiberg (DE)

( * ) Notice: Subject to any disclaimer, the term of this patent is extended or adjusted under 35 U.S.C. 154(b) by 198 days.

(21) Appl. No.: 13/241,431

(22) Filed: Sep. 23, 2011

(65) Prior Publication Data

US 2013/0077222 A1 Mar. 28, 2013

(51) Int. Cl.
*H05K 5/00* (2006.01)

(52) U.S. Cl.
USPC ...................................... 361/752; 361/379.01

(58) Field of Classification Search
USPC .................. 361/752, 679.01, 679.4, 707, 748
See application file for complete search history.

(56) References Cited

U.S. PATENT DOCUMENTS

| 2005/0273218 | A1* | 12/2005 | Breed et al. | 701/2 |
| 2009/0129432 | A1* | 5/2009 | Luniewski | 374/100 |
| 2013/0015495 | A1* | 1/2013 | Hauenstein | 257/140 |

* cited by examiner

*Primary Examiner* — Bernard Rojas
(74) *Attorney, Agent, or Firm* — Murphy, Bilak & Homiller, PLLC (57) ABSTRACT

A power semiconductor module includes a housing, a base plate disposed in the housing, a plurality of substrates mounted to the base plate, a plurality of power transistor die mounted to the substrates and a plurality of terminals mounted to the substrates and protruding through the housing. The terminals are in electrical connection with the power transistor die. The power semiconductor module further includes a wireless surface acoustic wave (SAW) temperature sensor disposed in the housing of the power semiconductor module.

20 Claims, 6 Drawing Sheets

POWER SEMICONDUCTOR MODULE WITH WIRELESS SAW TEMPERATURE SENSOR

TECHNICAL FIELD

The present application relates to power semiconductor modules, in particular power semiconductor modules with temperature sensors.

BACKGROUND

Temperature measurement within IGBT (insulated gate bipolar transistor) modules is typically realized using an NTC (negative temperature coefficient) thermistor. NTC thermistors have isolation requirements which require placement on a separate ceramic within the module housing and connection to dedicated additional terminals. Such a temperature sensor cannot be located closely to the most critical elements of the system—the power transistors—and the measured temperature data is less precise. Protective separation from the user also is not inherently available with such temperature sensors because NTC thermistors have externally accessible connection terminals. These terminals can be inadvertently contacted during use, causing severe electrical shock. Providing external isolation circuitry for reducing the risk of electric shock adds to the overall package cost. Also, more space is necessary for an NTC temperature sensor module and additional wire connections are needed to provide electrical connections to the temperature sensor. Extra electrical connections such as these reduce the life time of the module.

SUMMARY

Temperature measurement within a power transistor module is provided using a wireless SAW (surface acoustic wave) temperature sensor. The SAW temperature sensor functions based on the piezoelectric effect. Less space is needed for the SAW temperature sensor compared to conventional NTC sensors since the SAW sensor does not require terminals for inputting and outputting signals. Instead, communication with the SAW sensor is wireless. This in turn provides more freedom to place the SAW sensor in parts of the power transistor module not possible with conventional NTC sensors. For example, measurement of the temperature within the power transistor module can be made at the power terminal, at the base plate on which power transistors are mounted via substrates, at the substrates or at the power transistor die. The SAW temperature sensor also provides intrinsic protective separation for reducing the risk of electric shock, and no supply voltage within the module is needed for the SAW sensor.

According to an embodiment of a power semiconductor module, the module includes a housing, a base plate disposed in the housing, a plurality of substrates mounted to the base plate, a plurality of power transistor die mounted to the substrates, and a plurality of terminals mounted to the substrates and protruding through the housing. The terminals are in electrical connection with the power transistor die. The power semiconductor module further includes a wireless surface acoustic wave (SAW) temperature sensor disposed in the housing of the power semiconductor module.

According to an embodiment of a power semiconductor assembly, the assembly includes a power semiconductor module, a circuit board and an RF transceiver circuit. The power semiconductor module includes a housing, a base plate disposed in the housing, a plurality of substrates mounted to the base plate, a plurality of power transistor die mounted to the substrates, and a plurality of terminals mounted to the substrates and protruding through the housing. The terminals are in electrical connection with the power transistor die. The power semiconductor module further includes a wireless SAW temperature sensor disposed in the housing of the power semiconductor module. The circuit board is mounted to the housing and has a plurality of electrical connectors which receive the terminals protruding from the housing. The RF transceiver circuit is mounted to the circuit board and configured to transmit RF pulses to the wireless SAW temperature sensor and receive RF response signals generated by the wireless SAW temperature sensor in response to the RF pulses.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
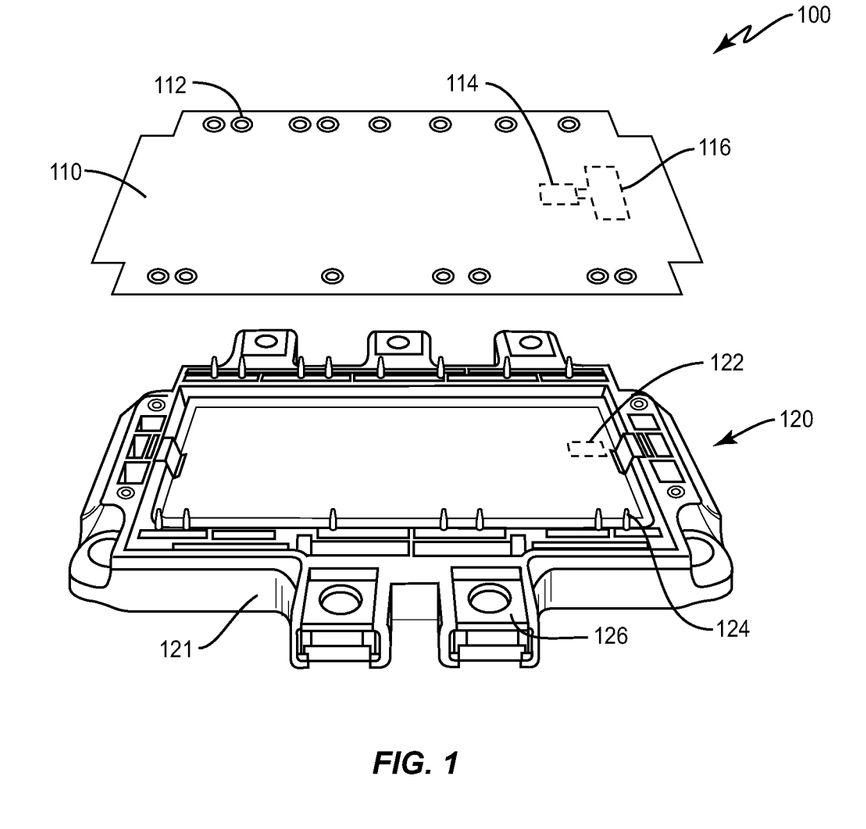
FIG. 1 illustrates a perspective view of an embodiment of a power semiconductor assembly including a power semiconductor module with a wireless SAW temperature sensor.

FIG. 1 illustrates an embodiment of a power semiconductor assembly 100. The assembly 100 includes a circuit board 110 and a power semiconductor module 120. Various active and passive components such as resistors, capacitors, inductors, power transistors (e.g. IGBTs), diodes, terminals, etc. are enclosed within the housing 121 of the power semiconductor module 120 and not visible in FIG. 1. Also included in the module housing 121 are one or more wireless surface acoustic wave (SAW) temperature sensors 122. One SAW sensor 122 is shown in FIG. 1 with a dashed box, but any desired number of SAW sensors can be enclosed in the module housing 121 for gathering temperature data about the power semiconductor module 120.

The circuit board 110 is mounted to the housing 121 of the power semiconductor module 120, although FIG. 1 shows the circuit board 110 e.g. a PCB (printed circuit board) detached from the module housing 121 for ease of illustration of the various assembly components. Components such as semiconductor die, passive elements, wiring traces, etc. are provided on and/or in the circuit board 110 and ensure proper operation of the power transistors contained inside the power semiconductor module 120 and are not shown in FIG. 1 for ease of illustration. The circuit board 110 also has a plurality of electrical connectors 112 for receiving terminals 124 protruding from the power module housing 121. Some terminals 124 protruding from the module housing 121 may be for control signals while other terminals 126 are power terminals.

An RF transceiver circuit 114 is also mounted to the circuit board 110. The RF transceiver circuit 114 and a corresponding antenna 116 are shown with dashed lines in FIG. 1 because these components are mounted to the bottom side of the circuit board 110 which faces the power semiconductor module 120 and therefore are out of view. The antenna 116 can be a wire or stripline formed as part of the circuit board 110. In one embodiment, the antenna 116 is spaced apart from the wireless SAW temperature sensor 122 by 10 cm or less, e.g. by between 5 cm and 10 cm. The RF transceiver circuit 114 and/or antenna 116 can instead be mounted on the top side of the circuit board 110 if desired.

In each case, the RF transceiver circuit 114 transmits RF pulses to the wireless SAW temperature sensor 122 via the antenna 116 and receives RF response signals generated by the wireless SAW temperature sensor 122 in response to the RF pulses. The RF response signals received at the RF transceiver circuit 114 are converted to temperature data which can be used to control operation of the power semiconductor module 120. For example, the temperature data can be reported to an entity remote from the power semiconductor subassembly 100 for use in remotely controlling operation of the module 120. The temperature data can be used to safely shut down one or more transistors included in the power module 120 if the temperature data indicates a problem e.g. if a maximum permitted temperature is exceeded.

Figure 2:
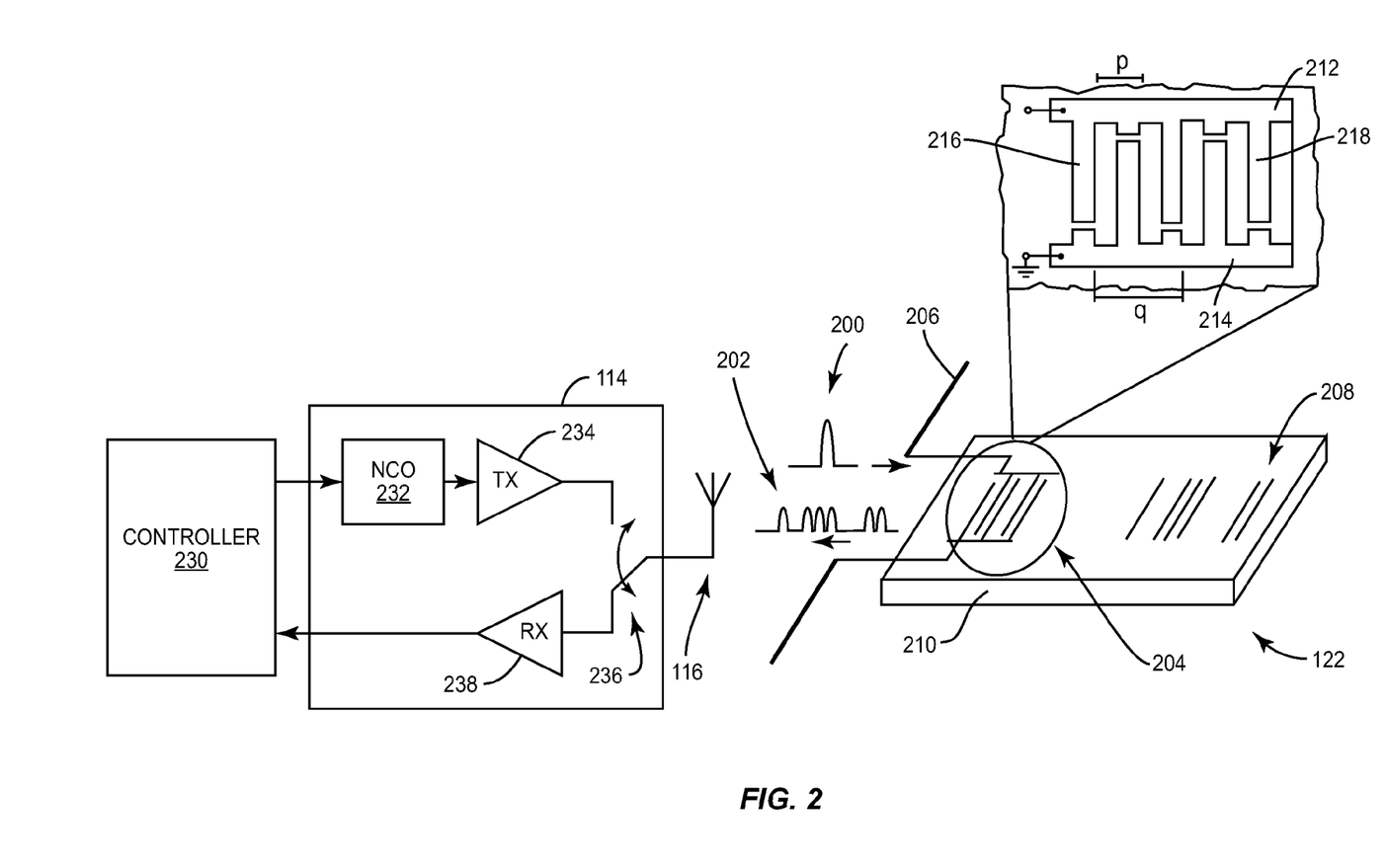
FIG. 2 illustrates an embodiment of a wireless SAW temperature sensor and corresponding controller and RF transceiver circuit for actuating and sensing the SAW sensor.

FIG. 2 illustrates the RF transceiver circuit 114 and wireless SAW temperature sensor 122 in more detail. The wireless SAW temperature sensor 122 is unpowered and receives an RF pulse signal 200 from the RF transceiver circuit 114. The SAW sensor 122 outputs an RF response signal 202 as a function of the RF pulse signal 200 received from the RF transceiver circuit 114 and the temperature of the SAW sensor 122.

The wireless SAW temperature sensor 122 includes an interdigital transducer 204 (or interdigital transformer, or IDT for short) connected to a sensor antenna 206 plus several reflectors 208 formed on the surface of a material 210 which exhibits elasticity such as a piezoelectric material like quartz, lithium niobate, lithium tantalate, lanthanum gallium silicate, etc. The IDT 204, which is enlarged in FIG. 2, includes electrode structures 212, 214 in the form of fingers 216, 218 connected to each other. The distance between two adjacent fingers 216/218 connected to the same electrode 212/214 is labeled 'p' in the enlarged view of the IDT 204. These two fingers 216/218 are at the same potential and have an electrical period labeled 'q' in the enlarged view of the IDT 204.

In response to an AC voltage applied to the electrode structures 212, 214, the surface of the SAW sensor 122 deforms based on the piezoelectric effect. This deformation causes an acoustic wave which propagates through and/or on the surface of the SAW sensor 122. Any changes to the characteristics of the propagation path affect the velocity and/or amplitude of the wave, which is reflected back to the IDT 204 by the reflectors 208. The reflectors 208 can be replaced by a second IDT which can be used to receive the propagation wave. In either case, changes in velocity can be monitored by measuring the frequency and/or phase characteristics of the SAW sensor 122 and can then be correlated to the corresponding physical quantity being measured e.g. temperature. In the opposite manner, an incoming wave on the surface of the SAW sensor 122 yields an AC voltage at the electrode structures 212, 214.

A temperature change at the SAW sensor 122 influences the propagation speed of the wave through/over the surface of the piezoelectric material 210 and therefore influences the overall electrical behavior of the SAW sensor 122. A signal with high frequency meets the SAW sensor 122 and the resulting surface acoustic wave changes depending on the temperature in altitude and phase lag. A controller 230 can interpret this signal received from the SAW sensor 122 to derive the corresponding temperature data. The SAW sensor 122 has a dedicated frequency band of operation and a defined relationship between output frequency and temperature. The controller 230 can use this information along with the characteristics of the RF pulse signal 200 transmitted to the SAW sensor 122 to convert the corresponding RF response signal 202 received from the SAW sensor 122 into temperature data.

The controller 230 also controls operation of the oscillator 232 (e.g. a numerical controlled oscillator, or NCO for short) provided as part of the RF transceiver circuit 114. The NCO 232 drives an RF transmitter 234 in order to periodically generate an RF pulse signal 200 directed to the SAW sensor 122 via the antenna 116 connected to the RF transceiver circuit 114. A switch 236 such as a duplexer connects the antenna 116 to either the transmitter 234 (for transmitting the RF pulse 200 to the SAW sensor 122) or a receiver 238 for receiving the corresponding RF response signal 202 from the SAW sensor 122. A distance of 10 to 15 m can exists between the polling RF pulse signal 200 and the corresponding received RF response signal 202. The controller 230 can be a discrete component e.g. on a driver board or be integrated in the module control unit which controls overall operation of the power semiconductor module 120, or in a frequency converter or servo drive circuit. If integrated as part of the system control circuit, the controller 230 can aid in the control of the power semiconductor module 120 based on the temperature data. The controller 230 can also report the temperature data to an entity remote from the power semiconductor subassembly e.g. via an Internet or wireless connection. Similarly the controller 230 can be remotely controlled from outside the power semiconductor subassembly.

Figure 3:
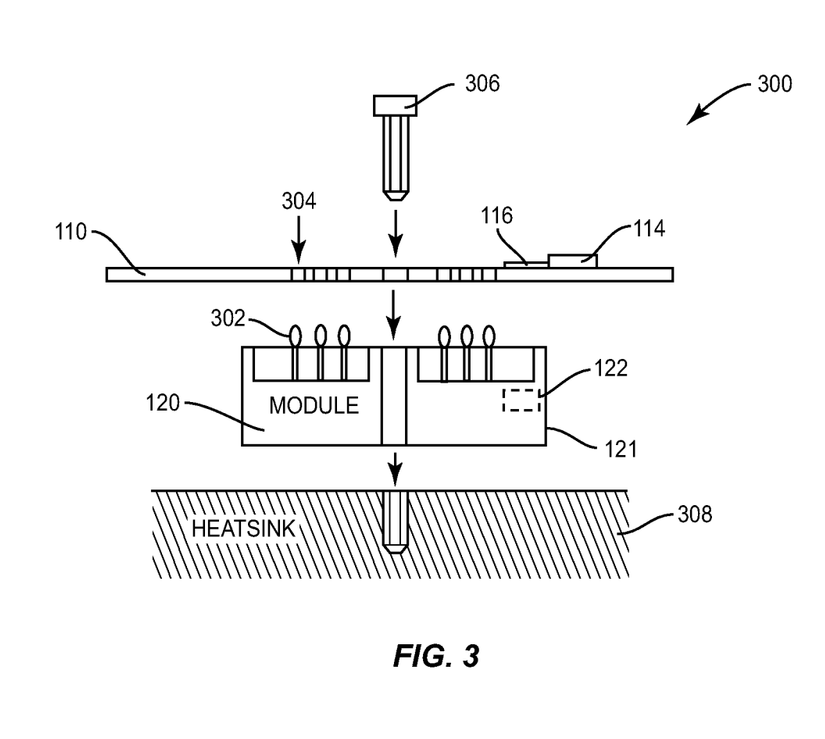
FIG. 3 illustrates a perspective cross-sectional view of another embodiment of a power semiconductor assembly including a power semiconductor module with a wireless SAW temperature sensor.

FIG. 3 illustrates another embodiment of a power semiconductor assembly 300. According to this embodiment, at least some of the terminals protruding from the power semiconductor module 120 are press-fit connectors 302 which are press-fit into corresponding electrical connectors 304 in the circuit board 110. A fastener 306 such as a screw or bolt can be used to fasten the circuit board 110 and the power semiconductor module 120 to a heat sink 308. One or more wireless SAW temperature sensors 122 are disposed within the module 120 as indicated by the dashed box. The RF transceiver circuit 114 and antenna 116 are shown disposed on the surface of the circuit board 110 facing away from the module 120. The RF transceiver circuit 114 and/or antenna 116 alternatively can be positioned on the opposite side of the circuit board 110 if desired.

Figure 4:
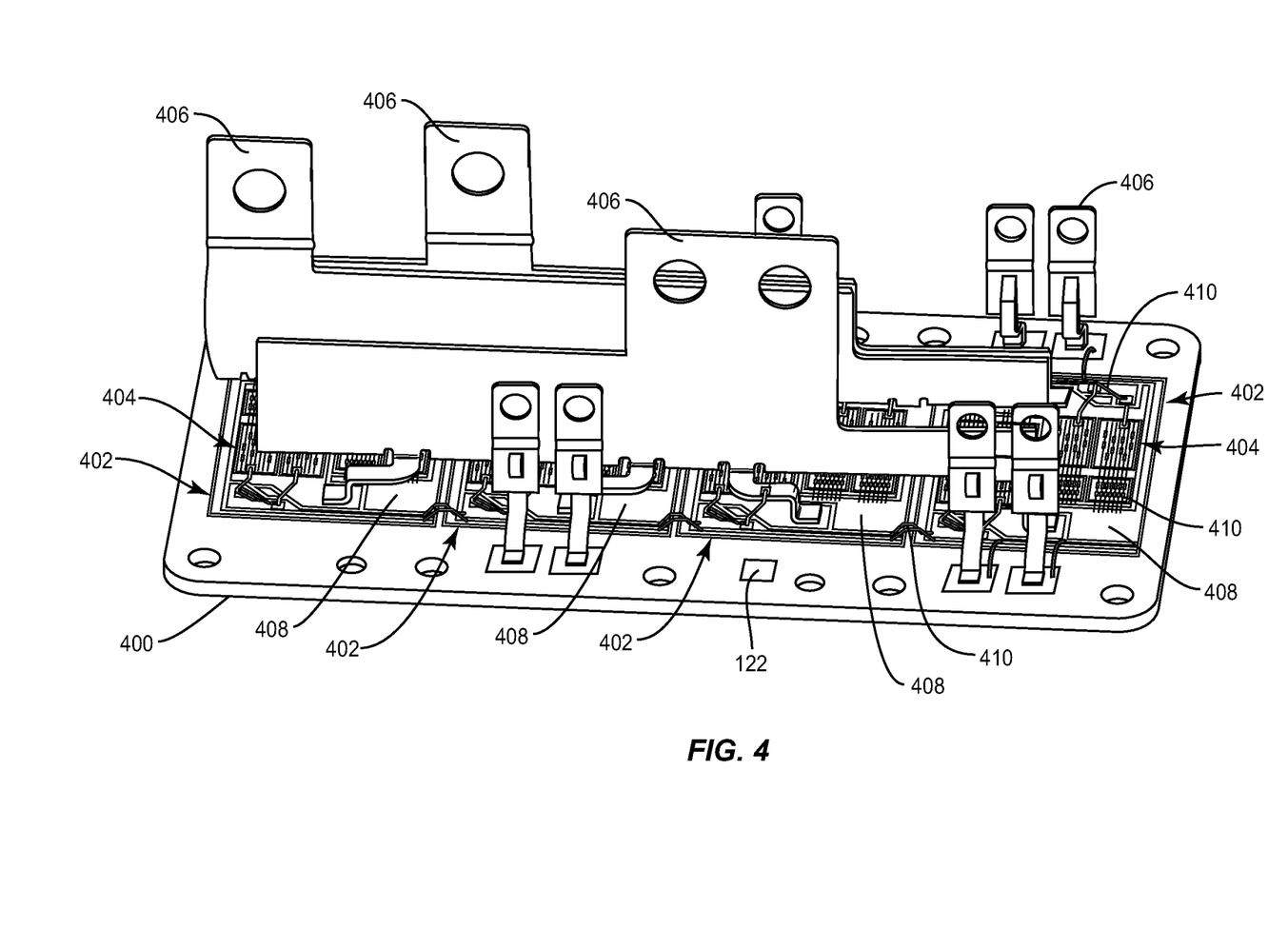
FIG. 4 illustrates a perspective view of an embodiment of a power semiconductor module with a wireless SAW temperature sensor.

FIG. 4 illustrates an embodiment of the power semiconductor module 120 with the housing 121 removed. The module 120 includes a base plate 400 disposed in the housing 121, a plurality of substrates 402 mounted to the base plate 400, a plurality of power transistor die 404 such as IGBT die mounted to the substrates 402 and a plurality of terminals 406 mounted to the substrates 402. The terminals 406 protrude through the module housing 121 e.g. as shown in FIGS. 1 and 2. The terminals 406 are in electrical connection with the power transistor die 404 e.g. via patterned metallization layers 408 disposed on the substrates 402 and bonding wires, ribbons, etc. 410 connecting the patterned metallization layers 408 to the die 404. One or more wireless SAW temperature sensors 122 are also disposed in the housing 121 of the power semiconductor module 120.

According to the embodiment illustrated in FIG. 4, the SAW temperature sensor 122 is attached to the base plate 400. For example, the sensor 122 can be soldered or glued to the base plate 400. A low temperature joining technology or diffusion soldering process can be employed to attach the SAW sensor 122 to the base plate 400. Other sensor attach processes may also be used. The temperature sensed by the SAW sensor 122 corresponds to that of the base plate 400 in this embodiment. The SAW temperature sensor 122 can be located in a different position, or additional SAW temperature sensors 122 can be provided at other locations within the module housing 121 to measure different temperatures.

Figure 5:
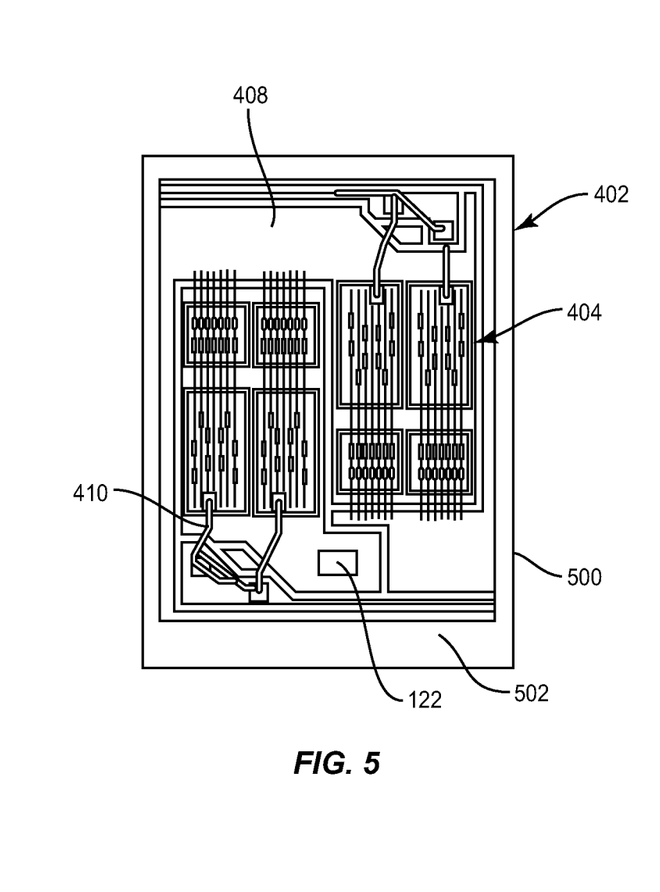
FIG. 5 illustrates a perspective view of an embodiment of a substrate with a wireless SAW temperature sensor included in a power semiconductor module.

FIG. 5 shows an embodiment of one of the substrates 402 included in the module housing 121 with a wireless SAW temperature sensor 122 attached to the substrate 402. According to this embodiment, the temperature sensed by this SAW sensor 122 corresponds to that of the substrate 402. In one embodiment, the substrate 402 to which the wireless SAW temperature sensor 122 is attached comprises a ceramic material 500 interposed between a top metallization 408 and a bottom metallization which is out of view in FIG. 5. The wireless SAW temperature sensor 122 is attached to one of the metallizations e.g. via glue, solder, etc. In FIG. 5, the SAW sensor 122 is attached to the top metallization 408 of the substrate 402. Examples of suitable ceramic materials 500 for use in the substrate 402 include aluminum nitride (AlN), aluminum oxide, (Al$_2$O$_3$), silicon nitride (Si$_3$N$_4$), silicon carbide (SiC), or beryllium oxide (BeO). The metallizations can comprise copper or a copper alloy having a high proportion of copper. The substrate 402 can be, for example, a DCB substrate (DCB=Direct Copper Bonding), a DAB substrate (DAB=Direct Aluminum Bonding), an AMB substrate (AMB=Active Metal Brazing), etc.

Figure 6:
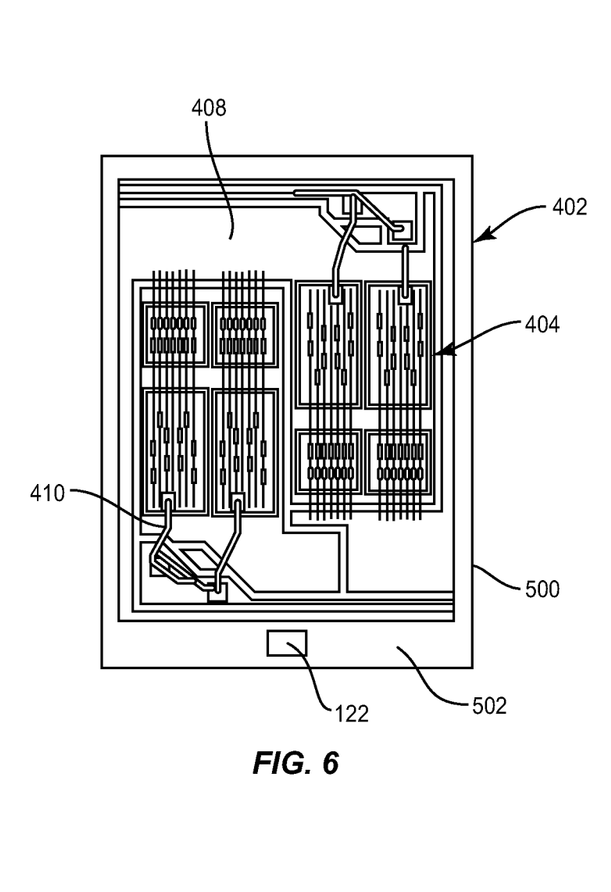
FIG. 6 illustrates a perspective view of another embodiment of a substrate with a wireless SAW temperature sensor included in a power semiconductor module.

FIG. 6 shows another embodiment of one of the substrates 402 included in the module housing 121 with a wireless SAW temperature sensor 122 attached to the substrate 402. According to this embodiment, a dielectric material 502 such as SiO2 is disposed on the ceramic material 500 of the substrate 402 and the SAW sensor 122 is disposed on the dielectric material 502. Alternatively the SiO2 layer can be realized on the metallization at the bottom side of the substrate 402 which is out of view in FIG. 6 and the SAW sensor 122 can be soldered or glued to the base plate 400 in this region of the substrate 402 e.g. in a recess formed in the base plate 400 so that the substrate 402 contacts the base plate 400 in a planar manner.

Figure 7:
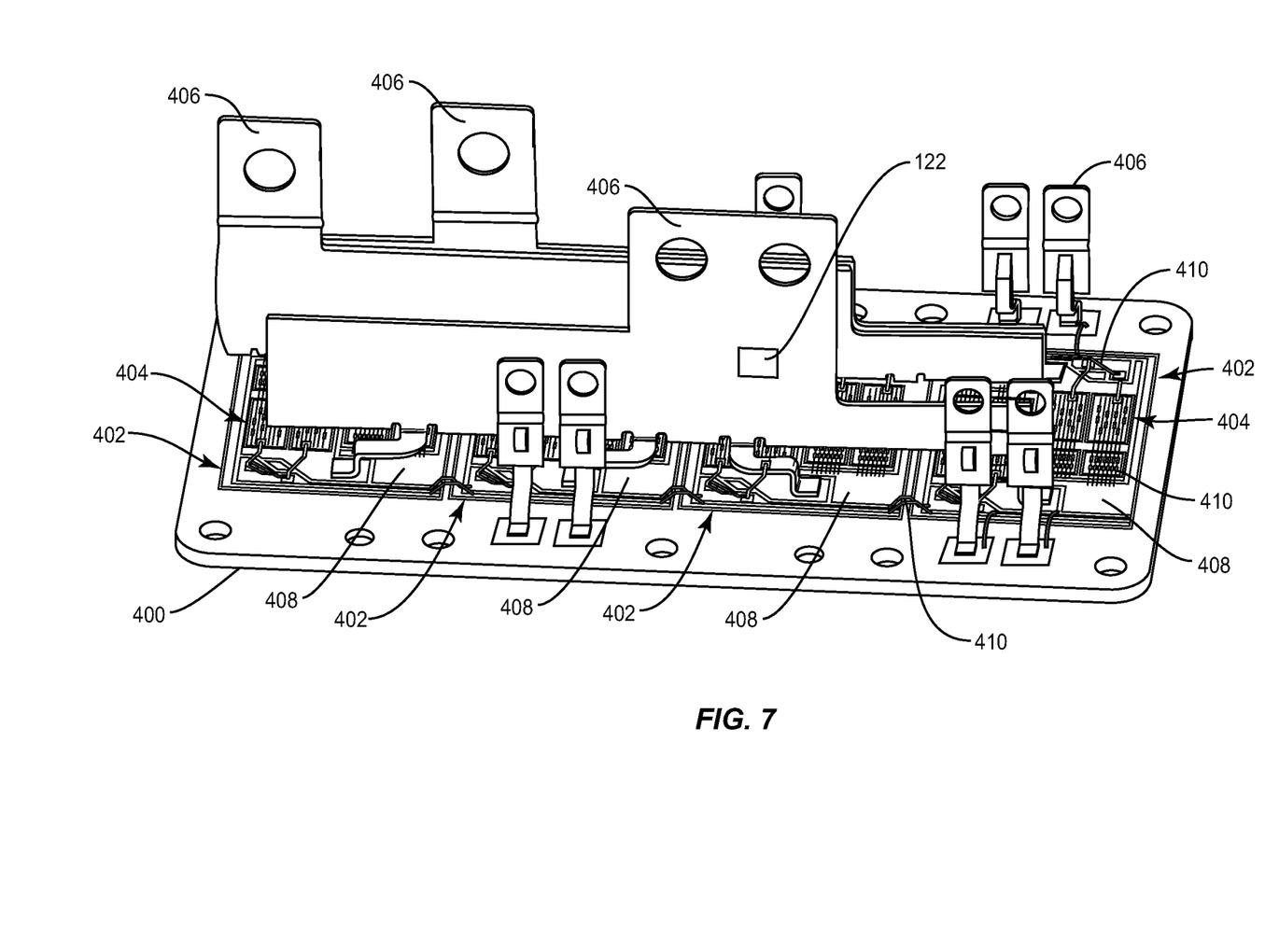
FIG. 7 illustrates a perspective view of another embodiment of a power semiconductor module with a wireless SAW temperature sensor.

FIG. 7 shows an embodiment of the power semiconductor module 120 without the housing 121 and with a wireless SAW temperature sensor 122 attached to one of the terminals 406 of the module 120. In one embodiment, this SAW sensor 122 is attached to the main power terminal of the module 120 e.g. the terminal connected to the drains of the power transistor die 404 included in the module 120. The SAW sensor 122 can be glued or soldered to the terminal 406 and the temperature sensed by this SAW sensor 122 corresponds to that of the terminal 406 which in turn correlates to the amount of current flowing in the power transistor die 404.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
   a housing;
   a base plate disposed in the housing;
   a plurality of substrates mounted to the base plate;
   a plurality of power transistor die mounted to the substrates;
   a plurality of terminals mounted to the substrates and protruding through the housing, the terminals in electrical connection with the power transistor die;
   a wireless surface acoustic wave (SAW) temperature sensor disposed in the housing of the power semiconductor module; and
   an RF transceiver circuit disposed in the housing and configured to transmit RF pulses to the wireless SAW temperature sensor and receive RF response signals generated by the wireless SAW temperature sensor in response to the RF pulses.

2. A power semiconductor module according to claim 1, wherein the wireless SAW temperature sensor is attached to the base plate.

3. A power semiconductor module according to claim 1, wherein the wireless SAW temperature sensor is attached to one of the substrates.

4. A power semiconductor module according to claim 3, wherein the substrate to which the wireless SAW temperature sensor is attached comprises a ceramic material interposed between first and second metallization layers, and the wireless SAW temperature sensor is attached to one of the metallization layers.

5. A power semiconductor module according to claim 3, wherein the substrate to which the wireless SAW temperature sensor is attached comprises a ceramic material interposed between first and second metallization layers, and the wireless SAW temperature sensor comprises an interdigital transducer on a dielectric disposed on the ceramic material of the substrate.

6. A power semiconductor module according to claim 1, wherein the wireless SAW temperature sensor is attached to one of the terminals.

7. A power semiconductor module according to claim 1, further comprising one or more additional wireless SAW temperature sensors disposed in the housing.

8. A power semiconductor module according to claim 1, wherein the wireless SAW temperature sensor is unpowered and operable to receive an RF pulse signal and output an RF response signal as a function of the RF pulse signal and a temperature of the wireless SAW temperature sensor.

9. A power semiconductor assembly, comprising:
a power semiconductor module comprising:
 a housing;
 a base plate disposed in the housing;
 a plurality of substrates mounted to the base plate;
 a plurality of power transistor die mounted to the substrates;
 a plurality of terminals mounted to the substrates and protruding through the housing, the terminals in electrical connection with the power transistor die; and
 a wireless surface acoustic wave (SAW) temperature sensor disposed in the housing of the power semiconductor module;
a circuit board mounted to the housing and having a plurality of electrical connectors which receive the terminals protruding from the housing; and
an RF transceiver circuit mounted to the circuit board and configured to transmit RF pulses to the wireless SAW temperature sensor and receive RF response signals generated by the wireless SAW temperature sensor in response to the RF pulses.

10. A power semiconductor assembly according to claim 9, further comprising a controller mounted to the circuit board and electrically connected to the RF transceiver circuit, the controller configured to convert the RF response signals received by the RF transceiver circuit to temperature data.

11. A power semiconductor assembly according to claim 10, wherein the controller is further configured to control operation of the power semiconductor module based on the temperature data.

12. A power semiconductor assembly according to claim 10, wherein the controller is further configured to report the temperature data to an entity remote from the power semiconductor subassembly.

13. A power semiconductor assembly according to claim 10, wherein the controller is remotely controllable from outside the power semiconductor subassembly.

14. A power semiconductor assembly according to claim 10, wherein the controller is configured to control an oscillator of the RF transceiver circuit for generating the RF pulses.

15. A power semiconductor assembly according to claim 9, wherein the RF transceiver circuit comprises an antenna disposed on the circuit board.

16. A power semiconductor assembly according to claim 15, wherein the antenna is a wire or stripline formed as part of the circuit board.

17. A power semiconductor assembly according to claim 15, wherein the antenna is spaced apart from the RF transceiver circuit by 10 cm or less.

18. A power semiconductor assembly according to claim 15, wherein the antenna is spaced apart from the RF transceiver circuit by between 5 cm and 10 cm.

19. A power semiconductor assembly according to claim 9, further comprising one or more additional wireless SAW temperature sensors disposed in the housing of the power semiconductor module.

20. A power semiconductor assembly according to claim 9, wherein the wireless SAW temperature sensor is attached to one of the substrates.

* * * * *